(12) United States Patent
Whang et al.

(10) Patent No.: US 8,748,966 B2
(45) Date of Patent: Jun. 10, 2014

(54) THREE DIMENSIONAL NON-VOLATILE MEMORY DEVICE AND METHOD OF MANUFACTURING THE SAME

(75) Inventors: Sung Jin Whang, Seoul (KR); Kwon Hong, Gyeonggi-do (KR); Ki Hong Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 413 days.

(21) Appl. No.: 13/272,601

(22) Filed: Oct. 13, 2011

(65) Prior Publication Data
US 2012/0092926 A1 Apr. 19, 2012

(30) Foreign Application Priority Data
Oct. 13, 2010 (KR) .................. 10-2010-0099758

(51) Int. Cl.
*H01L 29/788* (2006.01)
*H01L 27/115* (2006.01)

(52) U.S. Cl.
CPC ...... *H01L 27/11556* (2013.01); *H01L 29/7889* (2013.01)
USPC .... 257/316; 257/314; 257/315; 257/E27.103; 257/E29.3

(58) Field of Classification Search
CPC .............. H01L 27/11517; H01L 27/11551; H01L 27/11553; H01L 27/11556; H01L 29/788; H01L 29/7889; H01L 29/792; H01L 29/7926; G11C 16/0408
USPC .............. 257/314–316, 321, 324, E27.103, 257/E29.3, E29.309; 365/185.01, 185.17
See application file for complete search history.

(56) References Cited

U.S. PATENT DOCUMENTS

| | | | | |
|---|---|---|---|---|
| 8,338,244 B2 * | 12/2012 | Son et al. | ....................... | 438/201 |
| 8,440,528 B2 * | 5/2013 | Kito et al. | ..................... | 438/267 |
| 8,610,194 B2 * | 12/2013 | Aritome | ......................... | 257/315 |
| 2011/0254069 A1 * | 10/2011 | Kim et al. | ..................... | 257/315 |
| 2012/0132981 A1 * | 5/2012 | Imamura et al. | ............... | 257/321 |
| 2012/0213009 A1 * | 8/2012 | Aritome et al. | .......... | 365/185.29 |
| 2012/0267699 A1 * | 10/2012 | Kiyotoshi | ...................... | 257/319 |
| 2013/0049093 A1 * | 2/2013 | Lee et al. | ...................... | 257/316 |
| 2013/0049095 A1 * | 2/2013 | Whang et al. | ................... | 257/321 |
| 2013/0119452 A1 * | 5/2013 | Endoh et al. | .................... | 257/316 |
| 2013/0200450 A1 * | 8/2013 | Kusai et al. | ..................... | 257/324 |
| 2013/0292757 A1 * | 11/2013 | Aritome | ...................... | 257/316 |

FOREIGN PATENT DOCUMENTS

| | | |
|---|---|---|
| KR | 1020050029693 | 3/2005 |
| KR | 101045073 | 6/2011 |

OTHER PUBLICATIONS

Notice of Allowance issued from Korean Intellectual Property Office on Nov. 25, 2011.

* cited by examiner

*Primary Examiner* — Allison P Bernstein
(74) *Attorney, Agent, or Firm* — IP & T Group LLP

(57) ABSTRACT

A three dimensional non-volatile memory structure includes a plurality of interlayer dielectric layers and a plurality of control gates alternately stacked over a substrate, a channel formed to penetrate the plurality of interlayer dielectric layers and the plurality of control gates, a tunnel insulating layer formed to surround the channel, a plurality of floating gates disposed between the plurality of interlayer dielectric layers and the tunnel insulating layer, wherein the plurality of floating gates each have a thickness greater than a corresponding one of the interlayer dielectric layers, and a charge blocking layer disposed between the plurality of control gates and the plurality of floating gates.

17 Claims, 13 Drawing Sheets

US 8,748,966 B2

THREE DIMENSIONAL NON-VOLATILE MEMORY DEVICE AND METHOD OF MANUFACTURING THE SAME

CROSS-REFERENCE TO RELATED APPLICATION

Priority to Korean patent application number 10-2010-0099758 filed on Oct. 13, 2010, the entire disclosure of which is incorporated by reference herein, is claimed.

BACKGROUND

Exemplary embodiments relate to a semiconductor device and methods of manufacturing the same and, more particularly, to a non-volatile memory device having a three-dimensional (3-D) structure and methods of manufacturing the same.

A non-volatile memory device is a memory device that retains stored data even after a power supply is cut off. As the integration degree of two dimensional (2-D) memory devices with one layer of memories formed on a silicon substrate is reaching physical limits, three dimensional non-volatile memory devices having memory cells that are stacked vertically from a silicon substrate are being developed.

An example of a known three dimensional non-volatile memory device and features thereof are described in detail below.

FIG. 1 is a cross-sectional view illustrating the structure of a known charge trap-type non-volatile memory device having a three dimensional structure and a method of manufacturing the same.

As shown in FIG. 1, a plurality of interlayer dielectric layers 11 and a plurality of conductive layers 12 are alternately formed over a substrate 10 in which a source region (not shown) is formed. Trenches through which a surface of the substrate 10 is exposed are formed by etching the interlayer dielectric layers 11 and the conductive layers 12. A gate insulating layer 13 is formed on the inner walls of the trenches. The trenches are filled with a layer for a channel, thereby forming channels CH. Accordingly, a lower selection transistor LST is formed.

Next, a plurality of interlayer dielectric layers 14 and a plurality of conductive layers 15 are alternately formed over the resulting structure in which the lower selection transistor LST is formed. Here, the number of stacked interlayer dielectric layers 14 and the number of stacked conductive layers 15 are determined by the number of memory cells to be stacked.

Next, trenches through which the channels CH of the lower selection transistor LST are exposed are formed by etching the interlayer dielectric layers 14 and the conductive layers 15. Next, a charge blocking layer, a charge trap layer, and a tunnel insulating layer 16 are sequentially formed on the inner walls of the trenches. The trenches are filled with a layer for a channel, thereby forming channels CH. Here, the charge trap layer is used as a data storage space for storing or erasing data by trapping or discharging charges. According to an example, the charge trap layer is formed of a nitride layer. Accordingly, a plurality of memory cells MC is formed.

Next, a plurality of interlayer dielectric layers 17 and a plurality of conductive layers 18 are alternately formed over the plurality of memory cells MC. Trenches through which the channels CH of the memory cells MC are exposed are formed by etching the interlayer dielectric layers 17 and the conductive layers 18. Next, a gate insulating layer 19 is formed on the inner walls of the trenches. The trenches are filled with a layer for a channel, thereby forming channels CH. Accordingly, an upper selection transistor UST is formed.

Here, the plurality of memory cells MC is coupled in series between the lower selection transistor LST and the upper selection transistor UST, thus forming one string ST. Each of the channels CH is coupled to a bit line BL.

According to the above-described steps, the three dimensional charge trap-type non-volatile memory device including the charge trap layer for enabling each of the memory cells MC to trap charges may be formed. However, the charge trap-type non-volatile memory device has characteristics inferior to a floating gate-type non-volatile memory device for storing data by injecting charges into or discharging charges from the floating gate.

For example, a charge trap-type non-volatile memory device has slower program/erase operation speeds than a floating gate-type non-volatile memory device and also has data retention characteristics inferior to the floating gate-type non-volatile memory device. Here, the data retention characteristic may be degraded because the charge trap layers of the plurality of memory cells stacked along the channels are interconnected to each other.

BRIEF SUMMARY

Exemplary embodiments relate to a floating gate-type non-volatile memory device having a three dimensional structure and methods of manufacturing the same.

A three dimensional (3-D) non-volatile memory structure according to an aspect of the present disclosure includes a plurality of interlayer dielectric layers and a plurality of control gates alternately stacked over a substrate, a channel formed to penetrate the plurality of interlayer dielectric layers and the plurality of control gates, a plurality of floating gates disposed between the plurality of interlayer dielectric layers and the tunnel insulating layer, wherein the plurality of floating gates each have a thickness greater than a corresponding one of the interlayer dielectric layers, and a charge blocking layer disposed between the plurality of control gates and the plurality of floating gates.

A method of manufacturing a three dimensional non-volatile memory structure according to another aspect of the present disclosure includes alternately stacking a plurality of first material layers and a plurality of second material layers over a substrate; forming a first trench by etching the plurality of first material layers and the plurality of second material layers; forming a plurality of floating regions by recessing the first material layers exposed in the first trench, wherein the first material layers are recessed so that the second material layers partially protrude beyond the first material layers; etching the protruded second material layers so that the respective floating regions are expanded; forming a charge blocking layer on an entire surface of a structure having the expanded floating regions; forming a plurality of floating gates in the respective floating regions by filling a conductive layer in the floating regions and over the charge blocking layer; forming a tunnel insulating layer on the inner wall of the trench; and forming a channel layer on the tunnel insulating layer.

A three dimensional non-volatile memory structure according to another aspect of the present disclosure includes a plurality of interlayer dielectric layers and a plurality of control gates alternately stacked over a substrate and a plurality of floating gates coupled to the control gates through a charge blocking layer and spaced apart from each other through the control gates that are alternatively disposed with the floating gates, wherein the control gates are thinner at regions placed between the floating gates than other regions placed between the dielectric layers.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
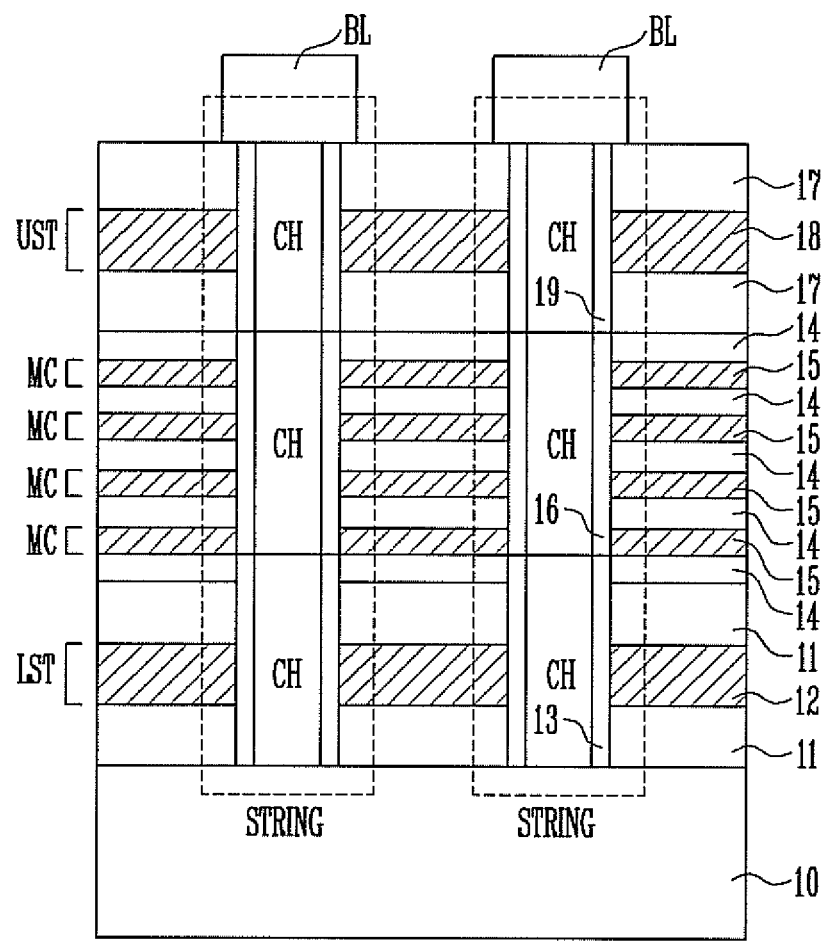
FIG. 1 is a cross-sectional view illustrating the structure of a known charge trap-type non-volatile memory device having a three dimensional structure and a method of manufacturing the same.
Figure 2:
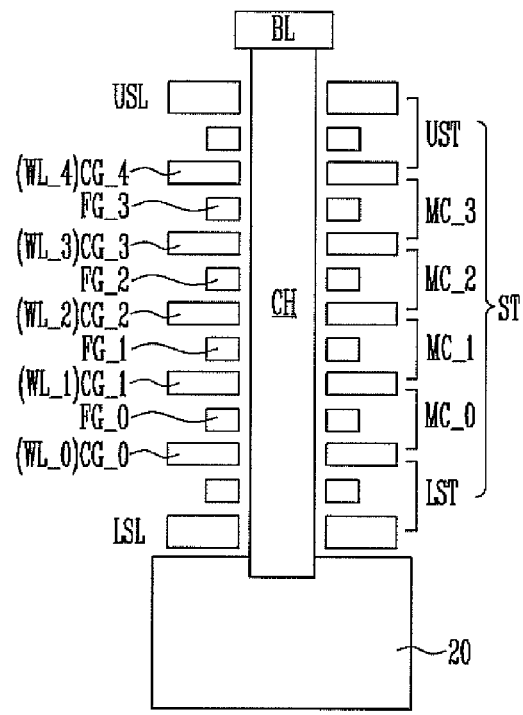
FIG. 2 is a diagram illustrating the structure of a floating gate-type non-volatile memory device having a three dimensional structure according to an exemplary embodiment of this disclosure.

FIG. 2 is a diagram illustrating the structure of a floating gate-type non-volatile memory device having a three dimensional structure according to an exemplary embodiment of this disclosure. For illustration purposes, a channel, floating gates, and control gates are mainly described, and insulating layers interposed therebetween may not be illustrated.

As shown, the three dimensional non-volatile memory device according to the exemplary embodiment of this disclosure includes a plurality of memory cells MC_0 to MC_3 stacked along a channel CH extending over a substrate 20. The plurality of memory cells MC_0 to MC_3 are coupled in series between a lower selection transistor LST and an upper selection transistor UST, thus forming one string ST (that is, a memory string). The string ST is coupled to a bit line BL.

The memory cell MC (MC_0 to MC_3) is described in more detail. A tunnel insulating layer (not shown) is formed to surround the channel CH extending over the substrate 20, and a plurality of floating gates FG (FG_0 to FG_3) and a plurality of control gates CG (CG_0 to CG_3) are alternately stacked along the channel CH. Furthermore, a charge blocking layer (not shown) is interposed between the plurality of floating gates FG and the plurality of control gates CG, thereby separating the floating gates FG and adjacent control gates CG from each other.

Each of the memory cells MC includes a floating gate FG and two control gates CG formed over and under the floating gate FG, respectively. For example, the memory cell MC_0 may include the floating gate FG_0, the control gate CG_1 formed over the floating gate FG_0, and the control gate CG_0 formed under the floating gate FG_0.

Here, two adjacent memory cells MC has a shared control gate CG. For example, the memory cell MC_0 and the memory cell MC_1 share the control gate CG_1, and the memory cell MC_1 and the memory cell MC_2 share the control gate CG_2.

According to the above-described structure, each memory cell MC is driven by two control gates CG. More specifically, a desired operation is performed by supplying a voltage to adjacent control gates CG over and under the floating gate FG of a memory cell to be driven. For example, to program the memory cell MC_0, a program voltage may be supplied to one of the control gate CG_0 and the control gate CG_1 or program voltages may be supplied to both of the control gate CG_0 and the control gate CG_1. If the program operation is performed using both of the two control gates CG_0 and CG_1, the program voltages supplied to the control gate CG_0 and the control gate CG_1 may be the same or different from each other. An erase operation and a read operation may be performed similarly by applying the same or different voltages to one or both of the control gates.

FIGS. 3A to 3D are cross-sectional views illustrating a method of manufacturing the floating gate-type non-volatile memory device having a three dimensional structure according to a first exemplary embodiment of this disclosure. For illustration purposes, a process of manufacturing the memory cells is described.

Figure 3A:
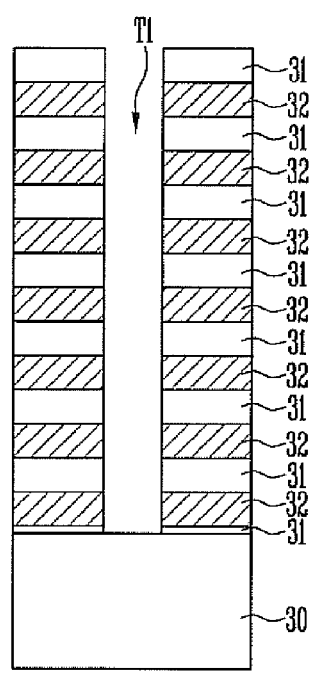
FIGS. 3A to 3D are cross-sectional views illustrating a method of manufacturing the floating gate-type non-volatile memory device having a three dimensional structure according to a first exemplary embodiment of this disclosure.

As shown in FIG. 3A, a plurality of interlayer dielectric layers 31 and a plurality of conductive layers 32 are alternately formed over a substrate 30. In the first embodiment, the interlayer dielectric layer 31 and the conductive layer 32 have the same thickness except for the bottommost interlayer dielectric layer 31.

The interlayer dielectric layer 31 provides a region in which floating gates will be formed in a subsequent process and functions to separate the control gates, formed under and over the floating gate, from each other. According to an example, the number of interlayer dielectric layers 31 and the number of conductive layers 32 may be determined to, for example, the number of memory cells MC to be stacked.

A trench T1 is formed by etching the plurality of interlayer dielectric layers 31 and the plurality of conductive layers 32. According to an example, the trench T1 may be formed so that all of the interlayer dielectric layers 31 are exposed to the inner wall of the trench T1.

Figure 3B:
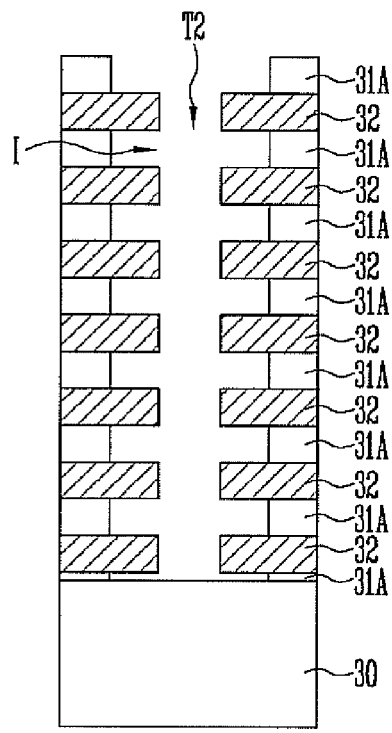

As shown in FIG. 3B, floating regions I are formed by recessing the respective exposed interlayer dielectric layers 31. According to an example, the recessed thickness may be determined by taking the thickness of a charge blocking layer and the floating gate, formed in a subsequent process, into consideration. In FIG. 3B, the recessed interlayer dielectric layer is denoted by reference character 31A, and a trench expanded by the floating regions I is denoted by reference character T2.

Figure 3C:
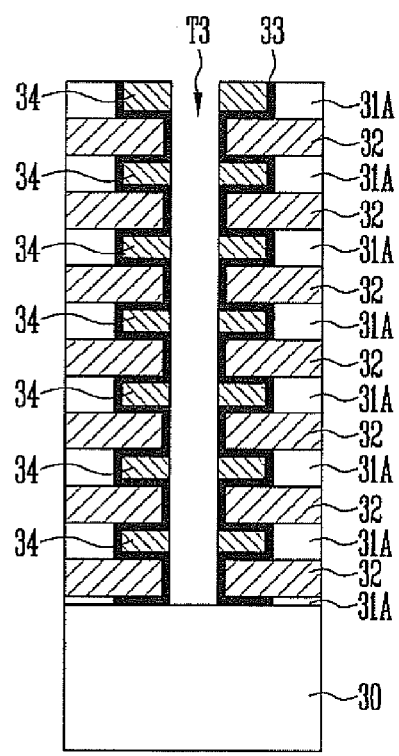

As shown in FIG. 3C, a charge blocking layer 33 is formed along the entire surface of the resulting structure in which the floating regions I are formed. Accordingly, the charge blocking layer 33 is formed in parts of the floating regions I.

Floating gates 34 are formed by filling a conductive layer within the respective floating regions I on which the charge blocking layer 33 is formed. For example, the floating gates 34 may be formed by filling the conductive layer within the trench T2, including the floating regions I, and subsequently performing an etch-back process for the conductive layer. Accordingly, the floating gates 34, each configured to be adjacent to the respective upper and lower portions of the adjacent control gates and surrounded by the charge blocking layer 33, are formed. In FIG. 3C, the trench in which the charge blocking layer 33 and the floating gates 34 are formed is denoted by reference character T3.

Figure 3D:
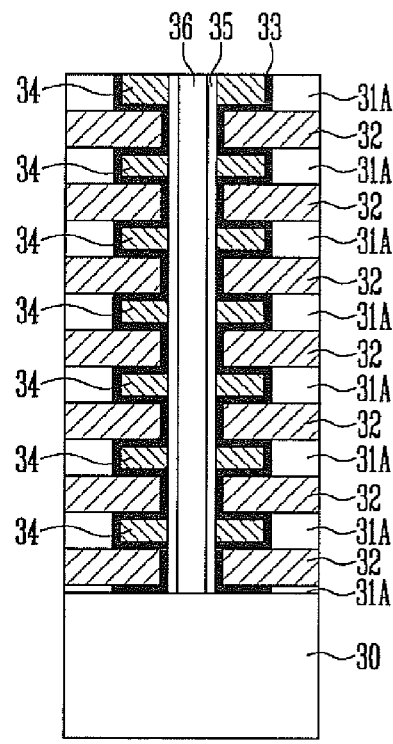

As shown in FIG. 3D, a tunnel insulating layer 35 is formed on the inner wall of the trench T3. For example, the tunnel insulating layer 35 may be formed by forming a material layer for tunnel insulation along the entire surface of the resulting structure in which the floating gates 34 are formed and subsequently exposing a surface of the substrate 30 at the bottom of the trench through an etch-back process. In order to prevent the tunnel insulating layer 35 from being damaged in a process of performing the etch-back process, the etch-back process may be performed after a passivation layer (not shown) is formed on the tunnel insulating layer 35.

A channel layer 36 is formed on the tunnel insulating layer 35. The channel layer 36 is formed to completely fill the center region or to partially expose the center region. If the channel layer 36 is formed to partially expose the center region, an insulating layer is filled in the exposed center region. In FIG. 3D, the channel layer 36 is formed to completely fill the center region.

In accordance with the first exemplary embodiment, since the floating gates are formed in the floating regions formed by recessing the interlayer dielectric layer, the floating-gate-type non-volatile memory device having a three dimensional structure may be provided. Here, adequate performance and reliability of a memory device may be obtained. Since a floating gate and two control gates are included in each memory cell, the memory cells may be driven using a relatively low program voltage and a relatively low erase voltage. Furthermore, an interference phenomenon may be reduced because the charge blocking layer is formed to surround the floating gates.

FIGS. 4A to 4E are cross-sectional views illustrating a method of manufacturing the floating gate-type non-volatile memory device having a three dimensional structure according to a second exemplary embodiment of this disclosure. The second exemplary embodiment is described below while overlapping descriptions with those of the first exemplary embodiment are omitted.

Figure 4A:
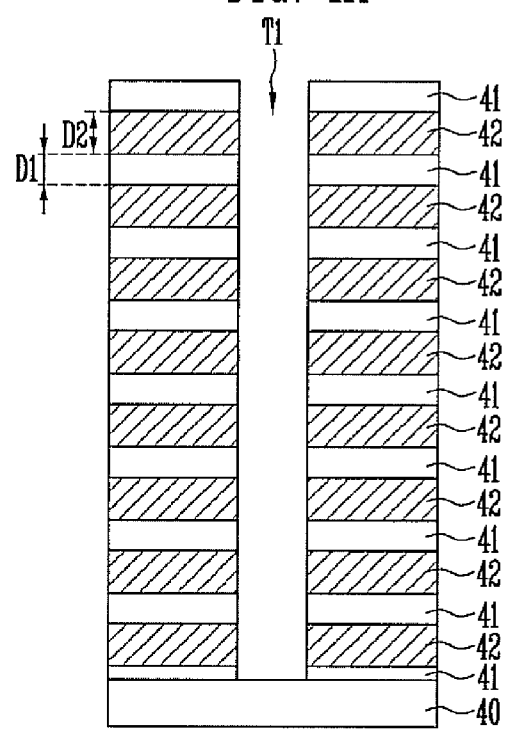
FIGS. 4A to 4E are cross-sectional views illustrating a method of manufacturing the floating gate-type non-volatile memory device having a three dimensional structure according to a second exemplary embodiment of this disclosure.

As shown in FIG. 4A, a plurality of first material layers and a plurality of second material layers are alternately formed over a substrate 40.

The first material layer and the second material layer are used to form a plurality of control gates stacked over the substrate. The first material layer is used to form an interlayer dielectric layer for separating the control gates from each other, and the second material layer is used to form the control gates through a subsequent process.

The first material layer and the second material layer are made of materials having a high etch selectivity. For example, the first material layer may be formed of an interlayer dielectric layer or a sacrificial layer, and the second material layer may be formed of a conductive layer or a sacrificial layer for the control gates.

In the second exemplary embodiment, an example in which the first material layers are the interlayer dielectric layers 41 and the second material layers are the conductive layers 42 for word lines is described.

According to an example, the conductive layer 42 may be formed of a silicon layer doped with N type or P type impurities and have an amorphous or polysilicon crystalline structure. According to an example, the interlayer dielectric layer 41 may be formed of an oxide layer.

Furthermore, the interlayer dielectric layer 41 has a smaller thickness than the conductive layer 42 (that is, D1<D2).

A trench T1 is formed by etching the interlayer dielectric layers 41 and the conductive layers 42. According to an example, the etch process may be a dry etch process.

Figure 4B:
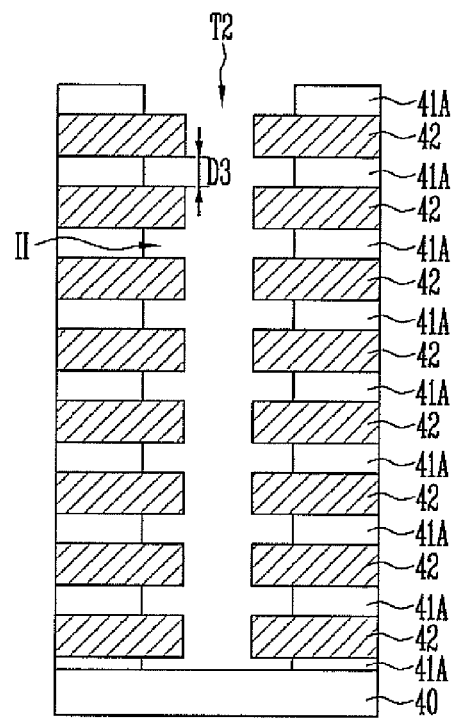

As shown in FIG. 4B, the interlayer dielectric layers 41 exposed to the inner wall of the trench T1 are recessed so that the conductive layers 42 partially protrude, thereby forming floating regions II. The thickness D3 of the floating region II is substantially the same as thickness D1 of the interlayer dielectric layer 41. In FIG. 4B, the interlayer dielectric layer that is partially recessed is denoted by reference character 41A.

Figure 4C:
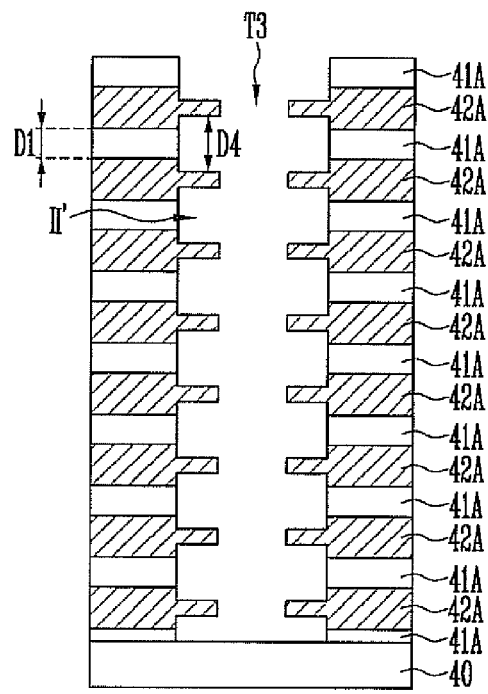

As shown in FIG. 4C, the conductive layers 42 extending over the floating regions II are selectively etched. According to an example, the etch process may be performed in a condition that the etch selectivity between the conductive layer 42 and the interlayer dielectric layer 41A is different. For example, the etch process may be performed using a wet etch process, a dry etch process, or a remote plasma process. The etch process for the extended conductive layer 42 is performed to increase the contact area of a floating gate and a charge blocking layer to be formed in a subsequent process. According to an example, the etched thickness of the conductive layer 42 may be controlled/determined by taking the interval between memory cells to be stacked into consideration. In increasing the thickness D3 of the floating region II to a thickness D4, the thickness D4 of the floating region II becomes larger than the thickness D1 of the interlayer dielectric layer 41A (that is, D1<D4).

In FIG. 4C, the conductive layer 42 is illustrated to be etched with sharp edges. However, if the etch process is performed using a wet etch process, the corner of the conductive layer 42 may have a smooth round shape. In this case, the concentration of an electric field at the corner of the control gate is prevented.

In FIG. 4C, the etched conductive layers are denoted by reference character 42A, and the expanded floating regions are denoted by reference character II', and the trench expanded by the expanded floating regions II' is denoted by reference character T3.

Figure 4D:
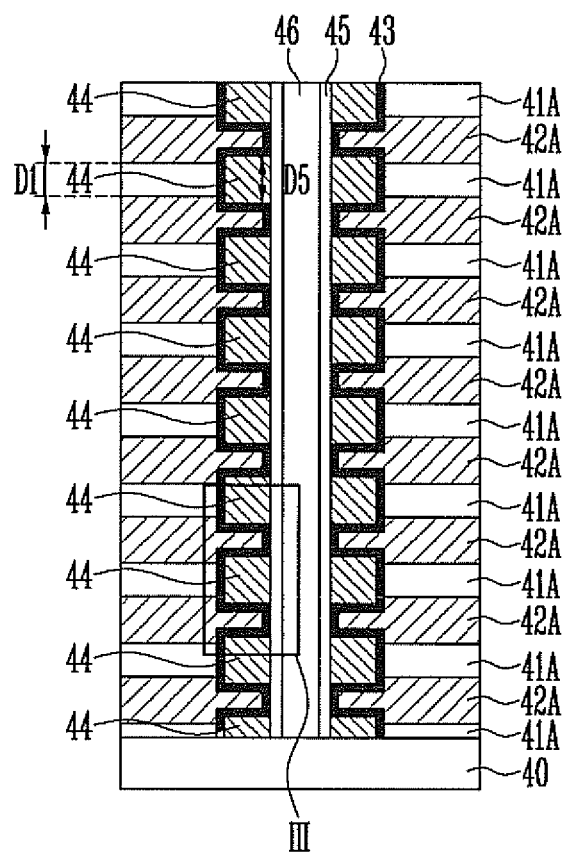

As shown in FIG. 4D, a charge blocking layer 43 is formed on the entire surface of the resulting structure including the expanded floating regions II'. According to an example, the charge blocking layer 43 may be formed of an oxide layer or be made of common insulating material. The charge blocking layer 43 may be formed with a uniform thickness along the entire surface of the resulting structure using a chemical vapor deposition (CVD) method. In this case, a sufficient region for forming the floating gate can be secured because the charge blocking layer 43 is formed within the expanded floating regions II'.

Next, the floating gates 44 are formed by filling a conductive layer within the respective floating regions II' on which the charge blocking layer 43 is formed. The thickness D5 of the floating gate 44 is greater than the thickness D1 of the interlayer dielectric layer 41A (that is, D1<D5). Here, the floating gate 44 is contacted with the conductive layers 42A formed over and under the floating gate 44 through the charge blocking layer 43, and the floating gate 44 extends over the conductive layers 42A. Therefore, the floating gate 44 and the conductive layer 42A contacts through the charge blocking layer 43 at at least two sides of the floating gate.

After a tunnel insulating layer 45 is formed on the inner wall of the trench in which the floating gates 44 are formed, a channel layer 46 is formed on the tunnel insulating layer 45.

Although not shown, after a trench for exposing the plurality of conductive layers 42A is formed by etching the plurality of interlayer dielectric layers 41A and the plurality of conductive layers 42A, the plurality of conductive layers 42A exposed to the inner wall of the trench may be silicided. An air gap may also be formed by etching the plurality of interlayer dielectric layers 41A, exposed to the inner wall of the trench. The silicidation process and the air gap formation process will be described later with reference to FIGS. 7A to 7C.

Figure 4E:
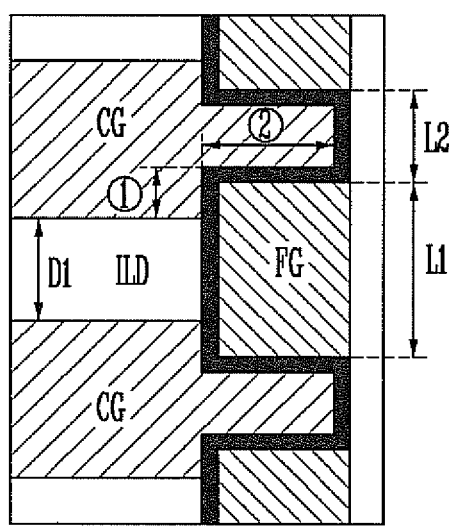

FIG. 4E is shown to illustrate a detailed shape of the floating gate of the floating gate-type non-volatile memory device having a three dimensional structure according to the second exemplary embodiment of this disclosure. FIG. 4E is an enlarged view of a region III in FIG. 4D.

As shown, the floating gate FG has a thickness greater than the interlayer dielectric layer ILD, and the control gate CG is thinner at regions placed between the floating gates FG than other regions placed between the dielectric layers ILD. Furthermore, a contacting surface between the floating gate FG and the control gate CG through the charge blocking layer vertically extends over the control gate CG.

According to the above-described structure, the floating gate FG and the control gate make contacts through the charge blocking layer at at least two surfaces (①  and ②). Here, the contacting surface between the floating gate FG and the control gate CG through the charge blocking layer may be three-dimensional. By having the three-dimensional contact surfaces, the contact area (①+②) of the floating gate FG and the control gate CG through the charge blocking layer 43 is increased. Thus, the contact area may be significantly increased.

Furthermore, the length L1 of the contacting surface between the floating gate FG and the tunnel insulating layer 45 is greater than the thickness D1 of the interlayer dielectric layer ILD. Here, the length L1 of the contacting surface between the floating gate FG and the tunnel insulating layer 45 corresponds to the length of the channel of the memory cell. Accordingly, the program speed may be increased because the length of the channel of the memory cell is increased.

In accordance with the second exemplary embodiment, after the floating regions are expanded, the charge blocking layer and the floating gates are formed. Accordingly, a floating gate having a sufficient thickness may be formed without being limited to the thickness of the interlayer dielectric layer, and thus the interlayer dielectric layer may be thin. Consequently, the manufacturing time and difficulties may be reduced, and the total thickness of the memory device may be decreased. Furthermore, an electric field may be prevented from being concentrated on sharp corners of the control gates. In addition, an adequate coupling ratio of the memory device may be obtained because the contact area of the floating gate and the charge blocking layer 43 is increased.

FIGS. 5A to 5E are cross-sectional views illustrating a method of manufacturing the floating gate-type non-volatile memory device having a three dimensional structure according to a third exemplary embodiment of this disclosure. The third exemplary embodiment is described below, where overlapping descriptions with those of the first and the second exemplary embodiments are omitted.

Figure 5A:
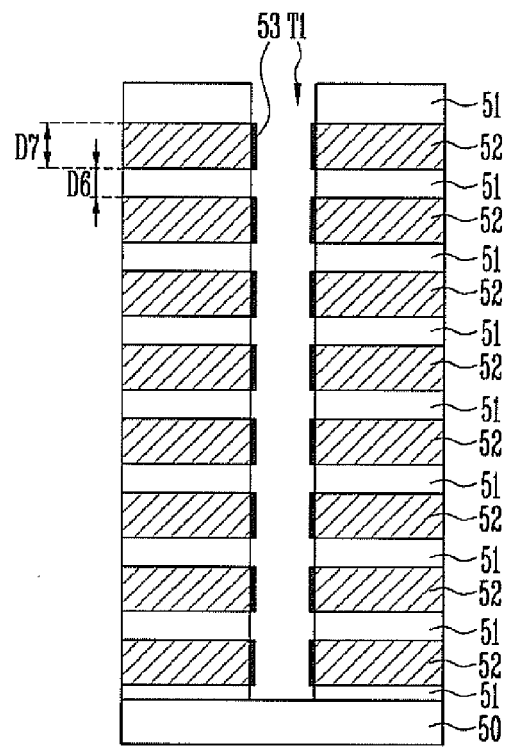
FIGS. 5A to 5E are cross-sectional views illustrating a method of manufacturing the floating gate-type non-volatile memory device having a three dimensional structure according to a third exemplary embodiment of this disclosure.

As shown in FIG. 5A, a plurality of first material layers and a plurality of second material layers are alternately formed over a substrate 50. An example in which the first material layer is an interlayer dielectric layer 51 and the second material layer is a conductive layer 52 for a control gate is described. The thickness D6 of the interlayer dielectric layer 51 is smaller than the thickness D7 of the conductive layer 52 (that is, D6<D7).

After a trench T1 is formed by etching the plurality of interlayer dielectric layers 51 and the plurality of conductive layers 52, a passivation layer 53 is formed on the plurality of conductive layers 52 exposed to the inner wall of the trench T1. The passivation layer 53 functions to prevent a reduction in the interval between memory cells which are stacked in a subsequent etch process for expanding floating regions. According to an example, the passivation layer 53 may be made of material having a different etch selectivity with respect to the interlayer dielectric layer 51.

For example, the passivation layer 53 may be a nitride layer formed by a selective nitrification process. If the conductive layer 52 is formed of a polysilicon layer and the interlayer dielectric layer 51 is formed of an oxide layer, the polysilicon layer is more easily nitrified than the oxide layer. Accordingly, the passivation layer 53 can be formed on a surface of the conductive layer 52 through the selective nitrification process.

Figure 5B:
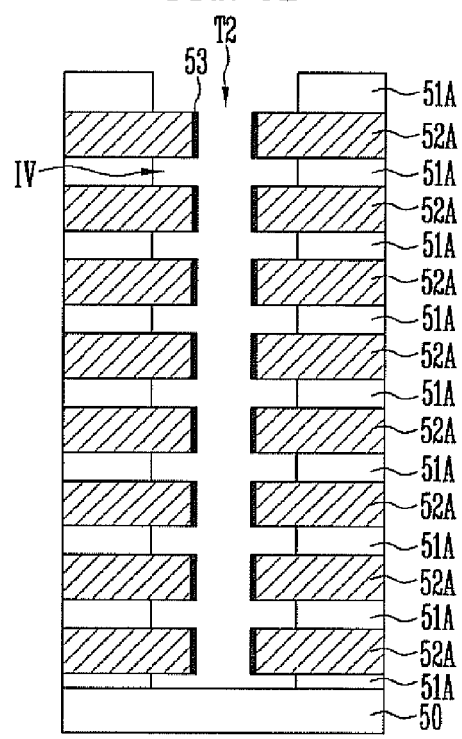

As shown in FIG. 5B, floating regions IV are formed by recessing the respective interlayer dielectric layers 51 exposed to the inner wall of the trench T1 so that the conductive layers 52 partially protrude. According to an example, the etch process for the interlayer dielectric layers 51 may be performed in a condition that the etch selectivity for the interlayer dielectric layer 51 with respect to the conductive layer 52 and the passivation layer 53 is different. In FIG. 5B, the etched interlayer dielectric layer is denoted by reference character 51A.

Figure 5C:
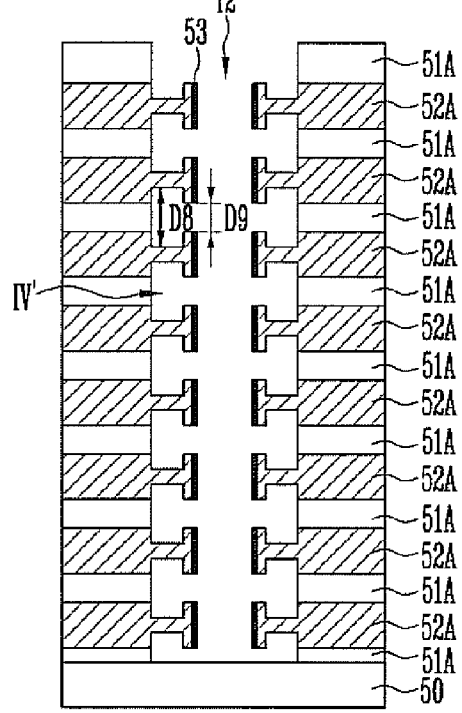

As shown in FIG. 5c, the protruded conductive layers 52 are selectively etched so that the floating regions IV are expanded. According to an example, the etch process is performed in a condition that the etch selectivity for the conductive layer 52 with respect to the interlayer dielectric layer 51A is different. Here, according to an example, only exposed portions of the conductive layer 52 are etched. In such a case, portions of the conductive layer 52 covered with the passivation layer 53 are not etched and retained. Accordingly, each of the protruded conductive layers 52 is etched in a T shape. The passivation layers 53 may also be etched in the process of etching the conductive layers 52.

Accordingly, the expanded floating regions IV' are formed. Here, according to an example, selected parts of each of the floating regions IV' are expanded. In FIG. 5C, the opening portion of the floating region IV' retains its thickness D9, while the remaining portion of the floating region IV' is expanded to have a thickness D8. In FIG. 5C, the etched conductive layer is denoted by reference character 52A.

Figure 5D:
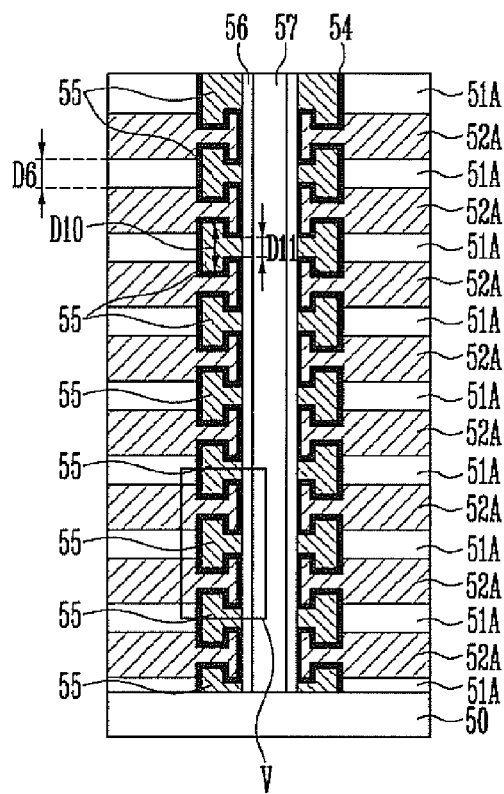

As shown in FIG. 5D, a charge blocking layer 54 is formed on the entire surface of the resulting structure in which the expanded floating regions IV' are formed. If the passivation layer 53 remains on a surface of the conductive layers 52A, according to an example, the passivation layer 53 may be removed and the charge blocking layer 54 may be subsequently formed. In this case, the passivation layer 53 may be removed using a strip process.

Floating gates 55 are formed by filling a conductive layer within the respective floating regions IV' on which the charge blocking layer 54 is formed. Thus, the floating gates 55 are formed in a T shape. After a tunnel insulating layer 56 is formed on the inner wall of the trench in which the floating gates 55 are formed, a channel layer 57 is formed on the tunnel insulating layer 56.

Here, according to an example, only a portion of the floating gates 55 has larger thickness than the interlayer dielectric layer 51A (that is, D6<D10). A contacting surface between the floating gate 55 and the tunnel insulating layer 56 has substantially identical length to the thickness D6 of the interlayer dielectric layer 51A, where a slightly difference in thickness may occur due to thickness of the charge blocking layer.

Figure 5E:
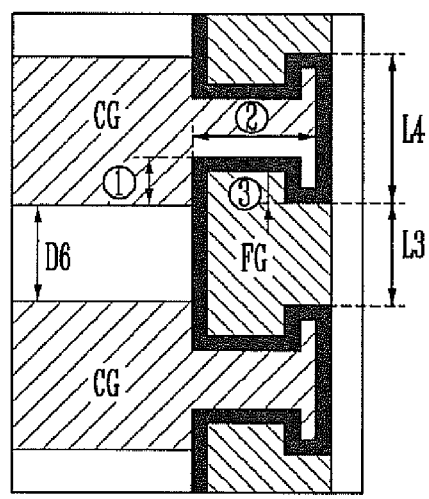

FIG. 5E is shown to illustrate a detailed shape of the floating gate of the floating gate-type non-volatile memory device having a three dimensional structure according to the third exemplary embodiment of this disclosure and is an enlarged view of a region V in FIG. 5D.

As shown, according to an example, parts of the contacting surface between the floating gate FG and the control gate CG through the charge blocking layer extend over the control gate CG. Thus, the floating gate FG includes a first region contacting the tunnel insulating layer and a second region contacting the interlayer dielectric layer ILD through the charge blocking layer. Here, a thickness of the first region is substantially same with a thickness of the interlayer dielectric layer and a thickness of the second region is greater than a thickness of the interlayer dielectric layer.

According to the above-described structure, the floating gate FG and control gate CG are contacted through the charge blocking layer at four surfaces. Here, the contact area (①+②+③) of the floating gate FG and the control gate CG through the charge blocking layer can be increased. Thus, the contact area of the floating gate FG and the control gate CG through the charge blocking layer increases. That is, adequate coupling ratio of the memory device may be obtained.

Furthermore, the contact area of the floating gate FG and the control gate CG through the charge blocking layer is increased, but the length L3 of the channel of the memory cell is substantially the same as the thickness D6 of the interlayer dielectric layer. Accordingly, the interval L4 between the stacked memory cells may be increased.

In accordance with the above process, the floating gate is formed by expanding, for example, only a part of the floating region. Accordingly, an adequate coupling ratio may be obtained because the contact area of the floating gate and the charge blocking layer may be increased. Furthermore, since the interval between the stacked memory cells is increased, an off current may be reduced.

FIGS. 6A to 6E are cross-sectional views illustrating a method of manufacturing the floating gate-type non-volatile memory device having a three dimensional structure according to a fourth exemplary embodiment of this disclosure.

The fourth exemplary embodiment relates to a method of forming control gates by removing sacrificial layers after forming floating gates and a channel using the sacrificial layers. A method of forming the floating gates is the same as that of the second exemplary embodiment, and thus, a description thereof is omitted. Furthermore, the method of forming the floating gates using the passivation layer, described in the third exemplary embodiment, may also be applied to the fourth exemplary embodiment.

Figure 6A:
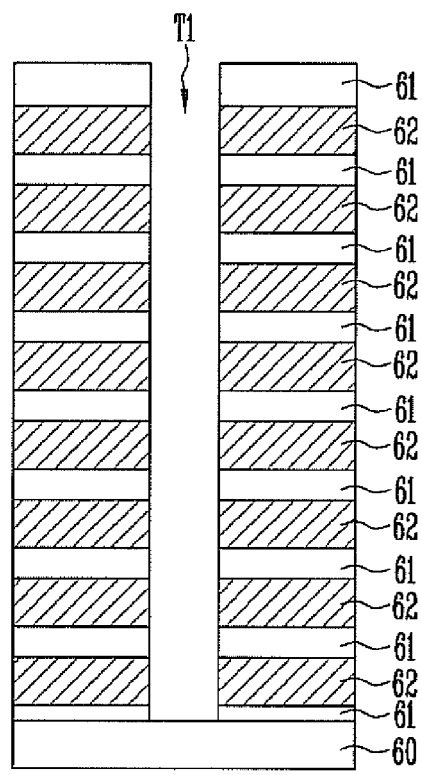
FIGS. 6A to 6E are cross-sectional views illustrating a method of manufacturing the floating gate-type non-volatile memory device having a three dimensional structure according to a fourth exemplary embodiment of this disclosure.

As shown in FIG. 6A, a plurality of first material layers and a plurality of second material layers are alternately formed over a substrate 60. In the present embodiment, an example in which the first material layer is an interlayer dielectric layer 61 and the second material layer is a sacrificial layer 62 is described.

The sacrificial layers 62 are formed to secure regions in which respective control gates are formed in a subsequent process. According to an example, the sacrificial layer 62 may be made of material having a higher etch selective with respect to the interlayer dielectric layer 61. For example, if the interlayer dielectric layer 61 is formed of an oxide layer, according to an example, the sacrificial layer 62 may be formed of a nitride layer. Here, the interlayer dielectric layer 61 has a smaller thickness than the sacrificial layer 62.

A trench T1 is formed by etching the plurality of interlayer dielectric layers 61 and the plurality of sacrificial layers 62.

Figure 6B:
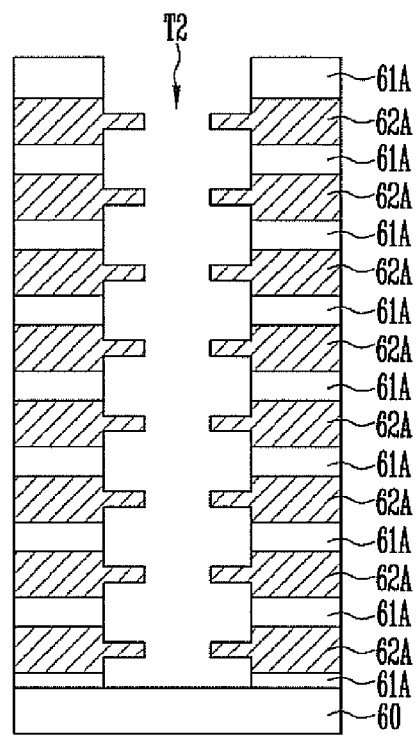

As shown in FIG. 6B, floating regions are formed by recessing the respective interlayer dielectric layers 61, exposed to the inner wall of the trench T1, to a desired thickness so that the sacrificial layers 62 partially protrude. Next, the protruded sacrificial layers 62 are selectively etched to a desired thickness so that the floating regions are expanded.

In FIG. 6B, the etched interlayer dielectric layers are denoted by reference character 61A, and the etched sacrificial layers are denoted by reference character 62A. A trench expanded by the floating regions is denoted by reference character T2.

Figure 6C:
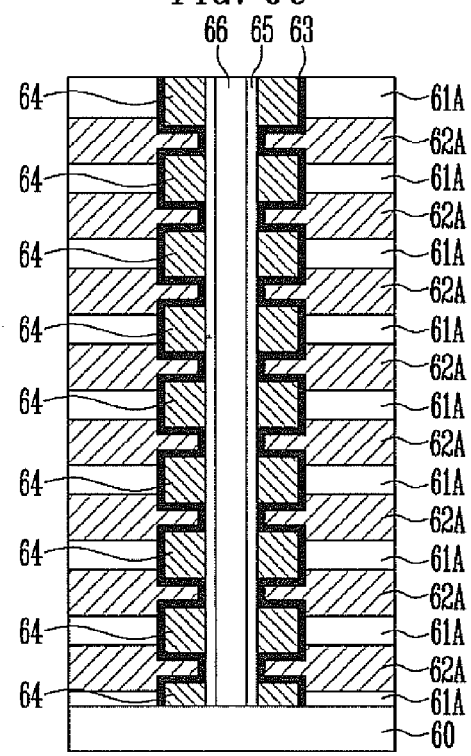

As shown in FIG. 6C, after a charge blocking layer 63 is formed along the entire surface of the resulting structure in which the floating regions are formed, floating gates 64 are formed by filling a conductive layer within the respective floating regions on which the charge blocking layer 63 is formed. A tunnel insulating layer 65 is formed on the inner wall of the trench in which the floating gates 64 are formed. A channel layer 66 is formed on the tunnel insulating layer 65.

Figure 6D:
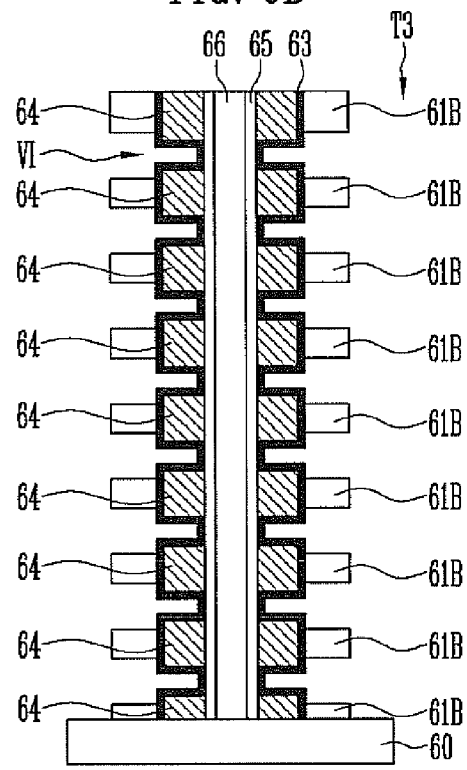

As shown in FIG. 6D, the plurality of interlayer dielectric layers 61A and the plurality of sacrificial layers 62A are etched to form a trench T3. According to an example, the trench T3 is formed to expose all of the sacrificial layers 62A.

Control regions VI are formed by removing the respective sacrificial layers 62A exposed to the inner wall of the trench T3.

Figure 6E:
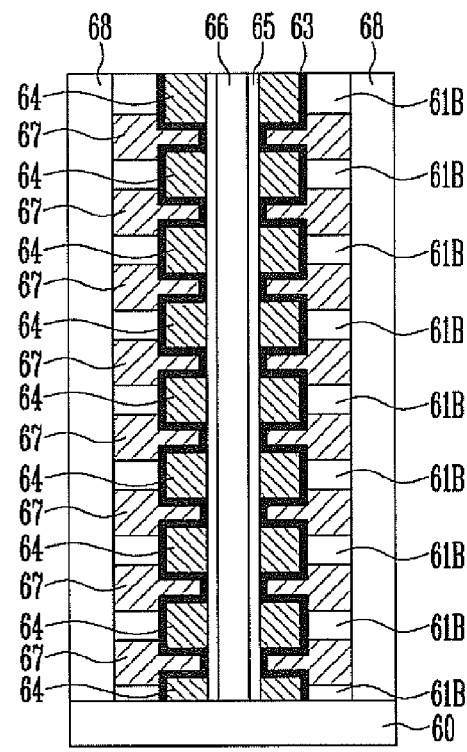

As shown in FIG. 6E, control gates 67 are formed by filling a conductive layer within the respective control regions VI. The conductive layer may be made of metal, such as tungsten (W). Next, an insulating layer 68 is filled in the trench.

Although not shown, before the insulating layer 68 is filled, the control gates 67 exposed to the inner wall of the trench T3 may be silicided. Furthermore, an air gap may be formed by etching the interlayer dielectric layers 61A, exposed to the inner wall of the trench T3, to a desired thickness. The silicidation process and the air gap formation process are described with reference to FIGS. 7A to 7C.

Meanwhile, in the fourth exemplary embodiment, the example in which the first material layer is the interlayer dielectric layer and the second material layer is the sacrificial layer has been described, but this disclosure is not limited thereto.

For example, the first material layer may be a sacrificial layer, such as an undoped polysilicon layer or an undoped amorphous silicon layer, and the second material layer may be a conductive layer for a control gate, such as a doped polysilicon layer or a doped amorphous silicon layer. The term 'doped' means that impurities, such as boron (B), have been injected, and the term 'undoped' means that impurities have not been injected.

In this case, after the trench is formed, insulating regions are formed by removing the plurality of first material layers, and the stacked control gates are separated from each other by filling an insulating layer within the insulating regions. Here, the second material layers exposed by the trench may be silicided. Furthermore, the air gap may be formed by filling the insulating layer within, for example, only a part of each of the insulating regions or by covering the top of the trench with the insulating layer in the state in which the trench regions are opened.

Figure 7A:
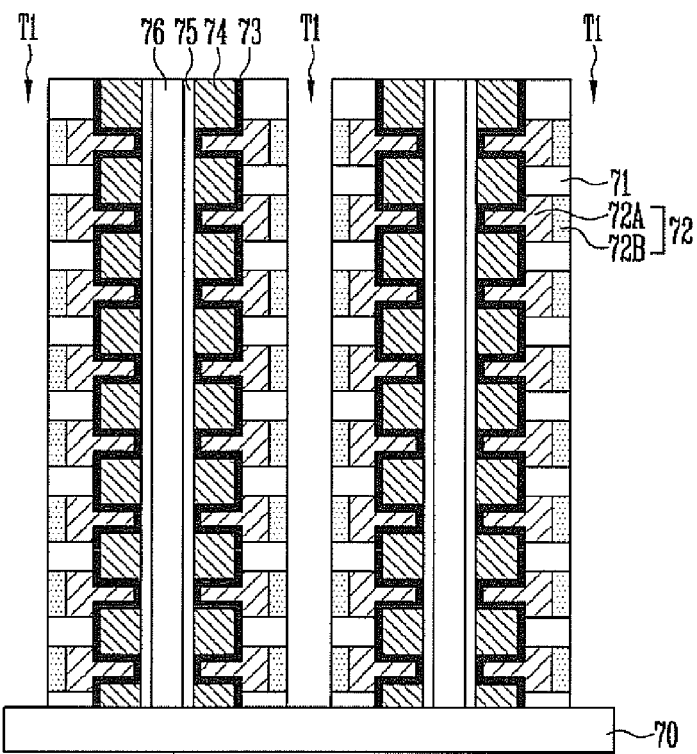
FIGS. 7A to 7C are cross-sectional views illustrating a method of manufacturing the floating gate-type non-volatile memory device having a three dimensional structure to which an air gap is applied according to a fifth exemplary embodiment of this disclosure.
Figure 7B:
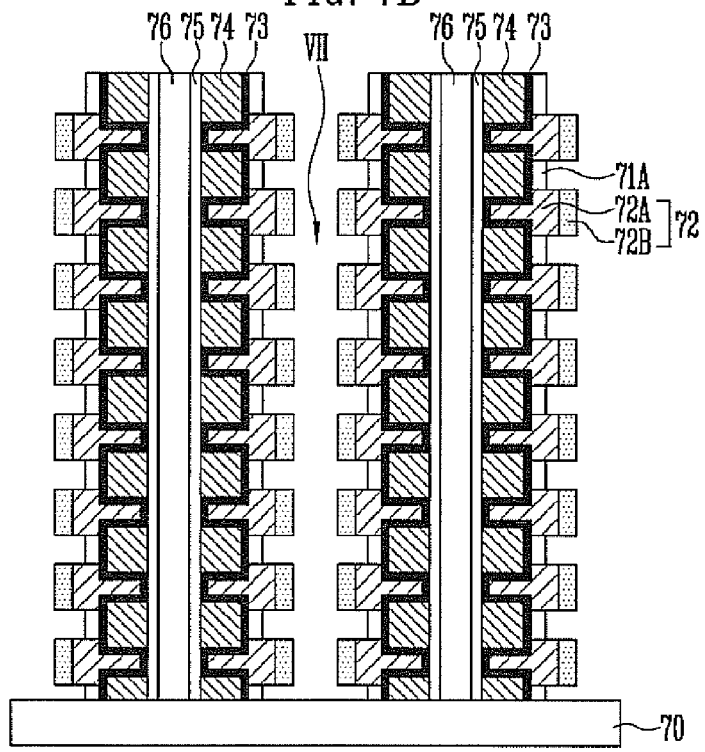
Figure 7C:
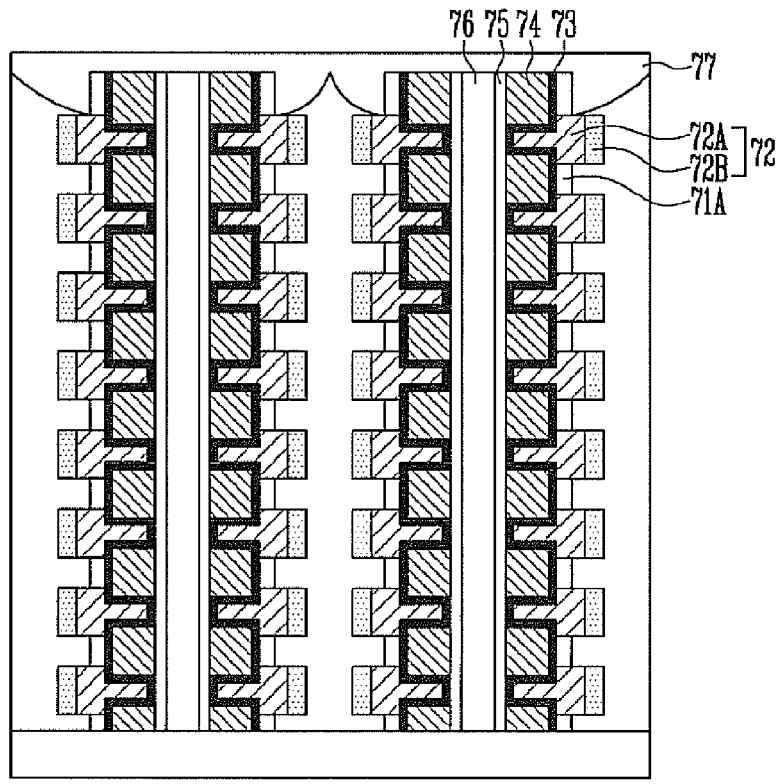

FIGS. 7A to 7c are cross-sectional views illustrating a method of manufacturing the floating gate-type non-volatile memory device having a three dimensional structure in which an air gap is formed according to a fifth exemplary embodiment of this disclosure. This embodiment illustrates an example in which a silicidation process and the air gap are used.

As shown in FIG. 7A, a plurality of memory cells is stacked along a channel 76 extending over a substrate 70. Here, while a particular illustration is shown, the memory cells may be formed according to any of the first, the second, the third, and the fourth exemplary embodiments. Each of the memory cells includes the channel 76, a tunnel insulating layer 75, a floating gate 74, and two control gates 72. A charge blocking layer 73 is interposed between the floating gate 74 and the control gate 72. In FIG. 7A, reference character 71 denotes an interlayer dielectric layer.

A trench T1 is formed by etching a plurality of the interlayer dielectric layers 71 and a plurality of conductive layers between the adjacent channels 76. Here, the conductive layers are patterned to form the respective control gates 72. However, as described with reference to the fourth exemplary embodiment, after control regions are formed by removing sacrificial layers, the control gates 72 may be formed by filling the conductive layer within the respective control regions.

After a metal layer is formed on the entire surface of the trench T1, the control gates 72 exposed to the inner wall of the trench T1 are silicided. Accordingly, part 72B of each of the control gates 72 is silicided. The remaining part of the control gate 72 that has not been silicided is denoted by reference character 72A.

As shown in FIG. 7B, the interlayer dielectric layers 71 exposed by the trench T1 are recessed to a desired thickness. Accordingly, an empty space (that is, an air gap VII) is formed between the adjacent control gates 72.

As shown in FIG. 7C, an insulating layer 77 is formed to cover the top of the air gap VII. According to an example, the insulating layer 77 may be deposited according to a plasma enhanced chemical vapor deposition (PECVD) method.

If the air gap VII is formed between the control gates 72 as described above, a capacitance value is significantly reduced. Accordingly, RC delay of the memory device may be improved, and adequate characteristics of the memory device may be obtained because interference between word lines may be reduced.

As described above, according to exemplary embodiments, a floating gate-type non-volatile memory device having a three dimensional structure is obtained. Accordingly, adequate performance and reliability of the memory device may be obtained. In particular, since one memory cell includes a floating gate and two control gates, the memory cell may be driven more easily using a relatively low program voltage and a relatively low erase voltage. Furthermore, an interference effect may be reduced because the charge blocking layer is formed to surround the front surface of the floating gate.

According to exemplary embodiments, the floating gate is formed to have a greater thickness than the interlayer dielectric layer. Accordingly, the contact area of the floating gate and the control gate through the charge blocking layer 43 may be increased and, at the same time, the thickness of the interlayer dielectric layers stacked to form the memory cells may be reduced. Accordingly, the total thickness of the memory device may be reduced, and the manufacturing time and difficulties may be reduced. In addition, since additional memory cells can be stacked, the integration degree of memory devices may increase.

Furthermore, since the contact area of the floating gate and the control gate through the charge blocking layer is increased, adequate coupling ratio and driving efficiency may be obtained. Furthermore, corners of the control gate may be formed to be smooth. Accordingly, characteristics of the memory device can be prevented from being degraded due to the concentration of an electric field at sharp corners of the control gate.

According to exemplary embodiments, a plurality of memory cells may be stacked along the channel extending over the substrate. However, these embodiments are exemplary only and do not limit the scope of the present invention. For example, inventive concepts discussed with respect to exemplary embodiments may also be applied to a U-shaped channel type non-volatile memory device including U-shaped channels in which adjacent channels are interconnected.

Figure 8:
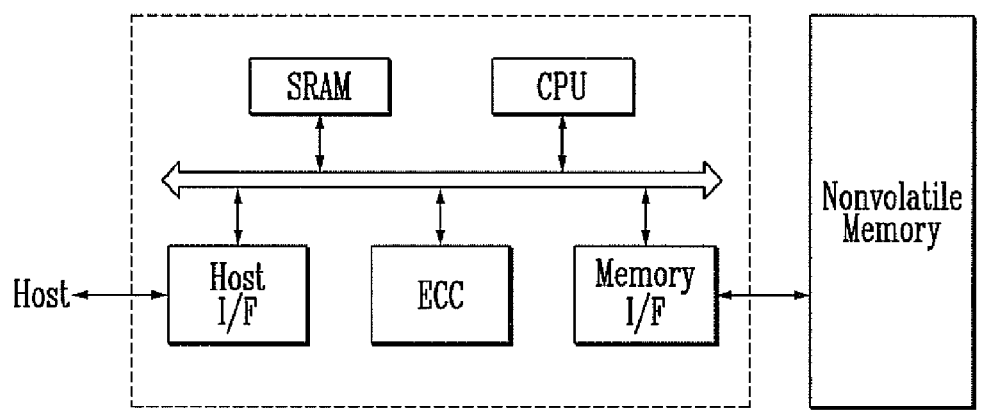
FIG. 8 shows the construction of a memory system according to a sixth exemplary embodiment of this disclosure.

As shown in FIG. 8, the memory system according to the embodiment of this disclosure includes a non-volatile memory device and a memory controller.

The non-volatile memory device is configured to have a structure described above with reference to the first to fifth embodiments. Furthermore, the non-volatile memory device may be a multi-chip package including a plurality of flash memory chips.

The memory controller controls the non-volatile memory device. The memory controller may include SRAM, a central processing unit (CPU), a host interface (I/F), an ECC, and a memory interface (I/F). The SRAM is used as the operation memory of the CPU. The CPU performs a general control operation for the data exchange of the memory controller. The host I/F includes the data exchange protocol of a host which is coupled to the memory system. Furthermore, the ECC detects and corrects an error included in data which is read from the non-volatile memory device. The memory I/F performs an interface with the non-volatile memory device. The memory controller may further include an RCM for storing code data for an interface with the host.

The memory system constructed as described above may be a memory card or a solid state disk (SSD) in which the non-volatile memory device and the controller are combined. For example, if the memory system is an SSD, the memory controller may communicate with the outside (for example, a host) through one of various interface protocols, such as a USB, an MMC, PCI-E, SATA, PATA, SCSI, ESDI, and IDE.

What is claimed is:

1. A three dimensional non-volatile memory structure, comprising:
    a plurality of interlayer dielectric layers and a plurality of control gates alternately stacked over a substrate;
    a channel formed to penetrate the plurality of interlayer dielectric layers and the plurality of control gates;
    a tunnel insulating layer formed to surround the channel;
    a plurality of floating gates disposed between the plurality of interlayer dielectric layers and the tunnel insulating layer, wherein the plurality of floating gates each have a thickness greater than a corresponding one of the interlayer dielectric layers; and
    a charge blocking layer disposed between the plurality of control gates and the plurality of floating gates.

2. The three dimensional non-volatile memory structure of claim 1, wherein the plurality of interlayer dielectric layers has a thickness smaller than the plurality of control gates.

3. The three dimensional non-volatile memory structure of claim 1, wherein each of the floating gates contacts a respective one of the control gates through the charge blocking layer at at least two interfacing surfaces.

4. The three dimensional non-volatile memory structure of claim 1, wherein the floating gate includes a first region contacting the tunnel insulating layer and a second region contacting the interlayer dielectric layer through the charge blocking layer, and a thickness of the first region is substantially same to a thickness of the interlayer dielectric layer and a thickness of the second region is greater than a thickness of the interlayer dielectric layer.

5. The three dimensional non-volatile memory structure of claim 4, wherein a thickness of the second region is greater than a length of a contacting face between the floating gate and the tunnel insulating layer.

6. The three dimensional non-volatile memory structure of claim 1, wherein each of a plurality of memory cells stacked along the channel comprises:
a floating gate of the floating gates; and
two adjacent ones of the control gates that are formed over and under the floating gate, respectively.

7. The three dimensional non-volatile memory structure of claim 6, wherein adjacent memory cells of the plurality of memory cells share a control gate of the control gates.

8. The three dimensional non-volatile memory structure of claim 1, further comprising an air gap formed between adjacent ones of the plurality of control gates.

9. A memory system, comprising a memory controller and a non-volatile memory device having the three dimensional non-volatile memory structure of claim 1,
wherein the three dimensional non-volatile memory structure is configured to be controlled by the memory controller.

10. A three dimensional non-volatile memory structure, comprising:
a plurality of interlayer dielectric layers and a plurality of control gates alternately stacked over a substrate; and
a plurality of floating gates coupled to the control gates through a charge blocking layer and spaced apart from each other through the control gates that are alternatively disposed with the floating gates, wherein the control gates are thinner at regions placed between the floating gates than other regions placed between the dielectric layers.

11. The three dimensional non-volatile memory structure of claim 10, wherein memory cells each include two immediately adjacent ones of the control gates and a floating gate placed between the two control gates and two immediately adjacent ones of the memory cells share a control gate.

12. The three dimensional non-volatile memory structure of claim 10, further comprising:
a channel formed to penetrate the plurality of interlayer dielectric layers and the plurality of control gates; and
a tunnel insulating layer formed to surround the channel.

13. The three dimensional non-volatile memory structure of claim 10, wherein the control gates each have regions with different thicknesses at a surface contacting the charge blocking layer.

14. The three dimensional non-volatile memory structure of claim 10, wherein the floating gate includes a first region contacting a tunnel insulating layer and a second region contacting the interlayer dielectric layer through the charge blocking layer, and a thickness of the first region is substantially same to a thickness of the interlayer dielectric layer and a thickness of the second region is greater than a thickness of the interlayer dielectric layer.

15. The three dimensional non-volatile memory structure of claim 10, wherein the floating gate has a T shape.

16. The three dimensional non-volatile memory structure of claim 10, wherein the plurality of interlayer dielectric layers has a thickness smaller than the plurality of control gates.

17. The three dimensional non-volatile memory structure of claim 10, further comprising an air gap formed between adjacent ones of the plurality of control gates.

* * * * *